United States Patent
Bono

(10) Patent No.: US 11,923,477 B2
(45) Date of Patent: Mar. 5, 2024

(54) METHOD FOR MANUFACTURING AN ELECTRONIC DEVICE

(71) Applicant: Commissariat à l'Énergie Atomique et aux Énergies Alternatives, Paris (FR)

(72) Inventor: Hubert Bono, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/276,801

(22) PCT Filed: Sep. 17, 2019

(86) PCT No.: PCT/EP2019/074840
§ 371 (c)(1),
(2) Date: Mar. 16, 2021

(87) PCT Pub. No.: WO2020/058256
PCT Pub. Date: Mar. 26, 2020

(65) Prior Publication Data
US 2021/0320221 A1   Oct. 14, 2021

(30) Foreign Application Priority Data
Sep. 18, 2018   (FR) ..................... 1858391

(51) Int. Cl.
*H01L 33/00*  (2010.01)
*H01L 21/02*  (2006.01)
(Continued)

(52) U.S. Cl.
CPC ...... *H01L 33/007* (2013.01); *H01L 21/02458* (2013.01); *H01L 21/0254* (2013.01);
(Continued)

(58) Field of Classification Search
CPC .......... H01L 21/02458; H01L 21/0254; H01L 21/02667; H01L 21/2654; H01L 29/2003;
(Continued)

(56) References Cited

U.S. PATENT DOCUMENTS

| 4,494,997 A | 1/1985 | Lemnios et al. |
| 4,509,990 A | 4/1985 | Vasudev |

(Continued)

FOREIGN PATENT DOCUMENTS

| EP | 0 871 208 A2 | 10/1998 |
| EP | 1 014 430 A1 | 6/2000 |

(Continued)

OTHER PUBLICATIONS

Sun et al., "AlGaN/GaN metal-insulator-semiconductor high electron mobility transistors with reduced leakage current and enhanced breakdown voltage using aluminum ion implantation," Applied Physics Letters 108 (2016) 013507.*

(Continued)

*Primary Examiner* — Jay C Kim
(74) *Attorney, Agent, or Firm* — Wolf, Greenfield & Sacks, P.C.

(57) ABSTRACT

A method of manufacturing an electronic device, including the successive steps of: a) performing an ion implantation of indium or of aluminum into an upper portion of a first single-crystal gallium nitride layer, to make the upper portion of the first layer amorphous and to preserve the crystal structure of a lower portion of the first layer; and b) performing a solid phase recrystallization anneal of the upper portion of the first layer, resulting in transforming the upper portion of the first layer into a crystalline indium gallium nitride or aluminum gallium nitride layer.

12 Claims, 4 Drawing Sheets

(51) Int. Cl.
  *H01L 21/265* (2006.01)
  *H01L 29/20* (2006.01)
  *H01L 31/18* (2006.01)
  *H01L 33/02* (2010.01)
  *H01L 33/32* (2010.01)

(52) U.S. Cl.
  CPC .... *H01L 21/02667* (2013.01); *H01L 21/2654* (2013.01); *H01L 29/2003* (2013.01); *H01L 31/1848* (2013.01); *H01L 31/1872* (2013.01); *H01L 33/0095* (2013.01); *H01L 33/025* (2013.01); *H01L 33/32* (2013.01)

(58) Field of Classification Search
  CPC ............. H01L 31/1848; H01L 31/1872; H01L 33/007; H01L 33/0095; H01L 33/025; H01L 33/32
  See application file for complete search history.

(56) References Cited

U.S. PATENT DOCUMENTS

| | | | | |
|---|---|---|---|---|
| 9,035,414 | B2* | 5/2015 | Minoura | H01L 29/66462 438/570 |
| 9,773,898 | B2* | 9/2017 | Roberts | H01L 29/7783 |
| 10,128,364 | B2* | 11/2018 | Hill | H01L 29/7786 |
| 11,127,596 | B2* | 9/2021 | Hwang | H01L 21/2654 |
| 2005/0136627 | A1* | 6/2005 | Melas | H01L 21/02458 257/E21.12 |
| 2019/0198623 | A1* | 6/2019 | Yue | H01L 29/32 |

FOREIGN PATENT DOCUMENTS

| | | |
|---|---|---|
| JP | 2009-239315 A | 10/2009 |
| WO | WO 84/02034 A1 | 5/1984 |
| WO | WO 2018/034840 A1 * | 2/2018 ............. H01L 21/20 |

OTHER PUBLICATIONS

Hernández-Gutierrez et al., "A new method of making ohmic contacts to p-GaN," Nuclear Instruments and Methods in Physics Research B 388 (2016) pp. 35-40.*

Katsikini et al., "Indium implantation and annealing of GaN: Lattice damage and recovery," Physica Status Solidi C 7 (2010) pp. 36-39.*

Lorenz et al., "Annealing Behaviour of GaN after Implantation with Hafnium and Indium," physica status solidi (b) 228 (2001) pp. 331-335.*

Katsikini et al., "X-ray absorption fine structure study of In implanted GaN: Effect of annealing," Materials Science and Engineering B 152 (2008) pp. 132-135.*

Lorenz et al., "Reversible changes in the lattice site structure for In implanted into GaN," Applied Physics Letters 80 (2002) pp. 4531-4533.*

Ronning et al., "Ion implanted dopants in GaN and AlN: Lattice sites, annealing behavior, and defect recovery," Journal of Applied Physics 87 (2000) pp. 2149-2157.*

Hernández-Gutiérrez et al., "InxGa1-xN nucleation by In+ ion implantation into GaN," Nuclear Instruments and Methods in Physics Research B 413 (2017) pp. 62-67.*

Taube et al., "Ion implantation for isolation of AlGaN/GaN HEMTs using C or Al," Physica Status Solidi A 212 (2015) pp. 1162-1169.*

Liu et al., "Co-doping of magnesium with indium in nitrides: first principle calculation and experiment," Royal Society of Chemistry Advances 6 (2016) pp. 5111-5115.*

Liu et al., "Analysis of Photoluminescence Thermal Quenching: Guidance for the Design of Highly Effective p-type Doping of Nitrides," Scientific Reports 6 (2016) 32033.*

Pampili et al., "Doping of III-nitride materials," Materials Science in Semiconductor Processing 62 (2017) pp. 180-191.*

International Preliminary Report on Patentability for PCT/EP2019/074840, dated Apr. 1, 2021.

International Search Report and Written Opinion for International Application No. PCT/EP2019/074840, dated Nov. 20, 2019.

Preliminary Search Report for French Application No. 1858391, dated Jun. 27, 2019.

Dussaigne et al., Technology LEDs: Bridging the green gap with a new foundation. Compound Semiconductor. Jul. 2017:28-33.

Even et al., Enhanced In incorporation in full InGaN heterostructure grown on relaxed InGaN pseudo-substrate. Applied Physics Letters. Jun. 26, 2017;110(26):262103.

Johnson et al., Dopant-enhanced solid-phase epitaxy in buried amorphous silicon layers. Physical Review B. Jul. 20, 2007;76(4):045216.

* cited by examiner

METHOD FOR MANUFACTURING AN ELECTRONIC DEVICE

This application is a national stage filing under 35 U.S.C. § 371 of International Patent Application Serial No. PCT/EP2019/074840, filed Sep. 17, 2019, which claims priority to French Patent application number 18/58391. The entire contents of these applications are incorporated herein by reference in their entirety.

TECHNICAL BACKGROUND

The present disclosure generally concerns light-emitting devices based on semiconductor materials and methods of manufacturing the same. It more particularly aims at a method of manufacturing a light-emitting device based on indium gallium nitride (InGaN) or on aluminum gallium nitride (AlGaN).

PRIOR ART

A light-emitting device conventionally comprises one or a plurality of light-emitting cells capable of converting an electric signal into a light radiation. Each light-emitting cell may comprise a stack of a first semiconductor layer of a first conductivity type electrically connected to an anode or cathode electrode of the cell, of an active layer, and of a second doped semiconductor layer of the second conductivity type electrically connected to a cathode or anode electrode of the cell. In operation, an electric current is applied between the first and second semiconductor layers of the cell. Under the effect of this current, the active layer emits a light radiation in a wavelength range which essentially depends on its composition.

Light-emitting cells where the active layer comprises one or a plurality of InGaN layers or one or a plurality of AlGaN layers have in particular been provided. In such cells, the emission wavelength particularly depends on the indium concentration in the InGaN layers of the active layer or on the aluminum concentration in the AlGaN layers of the active layer. More particularly, in light-emitting cells based on InGaN, the emission wavelengths shifts from blue to red when the indium concentration in the InGaN layers of the active layer increases. Similarly, in light-emitting cells based on AlGaN, the emission wavelengths shifts from blue to ultraviolet when the aluminum concentration in the AlGaN layers of the active layer increases.

An issue which arises is that, in known methods of manufacturing light-emitting cells based on InGaN or on AlGaN, the increase of the indium concentration in the InGaN layers of the active layer or of the aluminum concentration in the AlGaN layers of the active layer causes a degradation of the crystalline quality of the active layer, which results in degrading the cell performance. Such a limitation particularly results from lattice parameter mismatches between the InGaN or AlGaN layers of the active layer and an underlying base layer, generally made of gallium nitride (GaN), which mismatches are all the greater than the indium concentration in the InGaN layers of the active layer or the aluminum concentration in the AlGaN layers of the active layer is high.

Thus, although it is theoretically possible, in light-emitting cells based on InGaN, to cover the entire visible spectrum by adapting the indium concentration in the InGaN layers of the active layer, it is in practice difficult, or even impossible, to manufacture high-performance devices having a high indium concentration in the InGaN layers of the active layer. As a result, part of the theoretically available spectrum remains inaccessible in practice. Similarly, although it is theoretically possible, in light-emitting cells based on AlGaN, to cover a large spectrum ranging from blue to ultraviolet by adapting the aluminum concentration in the AlGaN layers of the active layer, it is in practice difficult, or even impossible, to manufacture devices having a high aluminum concentration in the AlGaN layers of the active layer or in the charge carrier injection layers surrounding the active layer, so that a portion of the theoretically available spectrum remains in practice inaccessible.

SUMMARY

Thus, an embodiment provides an electronic device manufacturing method, comprising the successive steps of:
a) performing an ion implantation of indium or of aluminum into an upper portion of a first single-crystal gallium nitride layer, to make the upper portion of the first layer amorphous and to preserve the crystal structure of a lower portion of the first layer; and
b) performing a solid phase recrystallization anneal of the upper surface of the first layer, resulting in transforming the upper portion of the first layer into a crystalline indium gallium nitride or aluminum gallium nitride layer.

According to an embodiment, the method further comprises, after step b), a step c) of deposition, by vapor phase epitaxy, on the upper surface of the first layer, of a light-emitting structure comprising:
a doped semiconductor layer of a first conductivity type coating the upper surface of the first layer;
an active layer coating the upper surface of the first conductivity type; and
a doped semiconductor layer of the second conductivity type coating the upper surface of the active layer.

According to an embodiment, during steps a) and b), a protection layer covers the upper surface of the first layer.

According to an embodiment, during step a), the implantation conditions are selected so that the lower portion of the first layer has a thickness smaller than one fifth of the thickness of the first layer.

According to an embodiment, during step a), a complementary implantation of nitrogen is performed to compensate for the indium or aluminum input in the upper portion of the first layer.

According to an embodiment, the implantation energies are selected so that the indium and nitrogen or aluminum and nitrogen concentration profiles are substantially superimposed at the interface between the upper portion and the lower portion of the first layer.

According to an embodiment, at step b), the solid phase recrystallization anneal is carried out at a temperature in the range from 300 to 1,200° C.

According to an embodiment, during steps a) and b), the first layer rests on an insulating layer itself resting on a support substrate.

According to an embodiment, step a) comprises a first step of ion implantation of indium or of aluminum on first and second portions of the surface of the first layer, followed by a second step of ion implantation of indium or of aluminum located on the second portion only of the surface of the first layer.

According to an embodiment, step c) is simultaneously carried out on the first and second portions of the surface of the first layer.

According to an embodiment, the electronic device is a light-emitting device.

According to an embodiment, the electronic device is a photoelectric conversion device.

According to an embodiment, the electronic device is a HEMT transistor.

BRIEF DESCRIPTION OF THE DRAWINGS

The foregoing and other features and advantages will be discussed in detail in the following non-limiting description of specific embodiments in connection with the accompanying drawings, in which.

DESCRIPTION OF THE EMBODIMENTS

Figure 1:
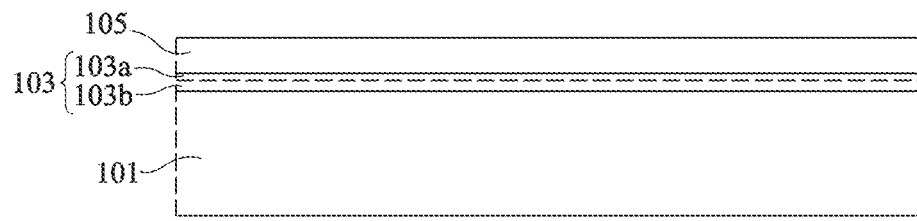
FIG. 1 shows a step of an example of a light-emitting device manufacturing method according to a first embodiment.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the exact composition and the method of manufacturing the active layers of the described light-emitting devices have not been detailed, the described embodiments being compatible with usual embodiments of such active layers of light-emitting devices based on InGaN or on AlGaN, provided to make the adaptations which may be necessary, which are within the abilities of those skilled in the art. Further, the forming of contacting metallizations on the anode and cathode semiconductor layers of the light-emitting cells and of possible peripheral insulation structures separating neighboring light-emitting cells has not been detailed, the described embodiments being compatible with the usual forming of such elements.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

The terms "about", "approximately", "substantially", and "in the order of" are used herein to designate a tolerance of plus or minus 10%, preferably of plus or minus 5%, of the value in question.

FIGS. 1 to 6 are cross-section views illustrating successive steps of an example of a light-emitting device manufacturing method according to a first embodiment.

FIG. 1 illustrates an initial structure comprising a support substrate 101, for example, made of sapphire or of silicon, an insulating layer 103, for example, made of silicon oxide, coating the upper surface of support substrate 101, and a single-crystal gallium nitride (GaN) layer 105 coating the upper surface of layer 103. The lower and upper surfaces of insulating layer 103 are for example in contact respectively with the upper surface of substrate 101 and with the lower surface of GaN layer 105.

The stack of FIG. 1 may be obtained by a transfer method comprising:

forming single-crystal GaN layer 105, for example, by vapor phase epitaxy, on a surface of a growth substrate (not shown);

forming a silicon oxide layer 103a on the surface of GaN layer 105 opposite to the growth substrate (the lower surface of layer 105 in FIG. 1);

forming a silicon oxide layer 103b on a surface (the upper surface in FIG. 1) of support substrate 101;

transferring the assembly comprising the growth substrate, GaN layer 105, and silicon oxide layer 103a onto the assembly comprising support substrate 101 and silicon oxide layer 103b, to place in contact and bond by direct gluing or molecular bonding the surface of layer 103a opposite to GaN layer 105 to the surface of layer 103b opposite to support substrate 101; and remove the growth substrate to free the access to the surface of GaN layer 105 opposite to layer 103a.

Preferably, the transfer method used to form the stack of FIG. 1 is a method of SMART CUT (trade name) type, wherein:

a GaN layer initially formed on the growth substrate (not shown) has a thickness greater than that of layer 105;

a buried hydrogen layer is implanted into the GaN layer from the surface of the GaN layer opposite to the growth substrate; and the removal of the growth substrate is performed by cleaving of the initial GaN layer at the level of the buried hydrogen layer, to only keep on the support substrate the portion of the GaN layer arranged on the side of the buried hydrogen layer opposite to the growth substrate (corresponding to layer 105 of the structure of FIG. 1).

The use of a method of SMART CUT type has the advantage of enabling to transfer a relatively thin GaN layer 105, of high crystal quality and relatively lightly strained, onto the upper surface of substrate 101.

As an example, the stack of FIG. 1 is obtained by a method similar to the method described in the article entitled "Bridging the green gap with a new foundation" of Amélie Dussaigne and David Sotta (www.compoundsemiconductor.net—July 2017), modified to replace the single-crystal InGaN donor substrate provided in the article with a single-crystal GaN donor substrate.

In the above-described examples, intermediate insulating layer 103 is formed by the stack of layers 103a and 103b. As an example, layer 103 has a thickness in the range from 100 nm to 1 µm, for example, in the order of 500 nm. GaN layer 105 has, for example, a thickness in the range from 10 to 500 nm, and preferably from 20 to 100 nm. Layer 103 and layer 105 for example extend continuously over substantially the entire upper surface of support substrate 101.

Figure 2:
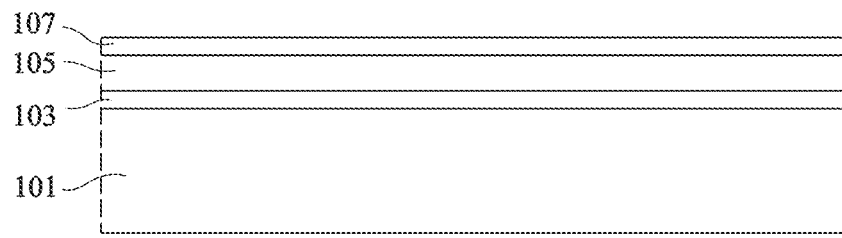
FIG. 2 shows another step of an example of a light-emitting device manufacturing method according to the first embodiment.
Figure 4:
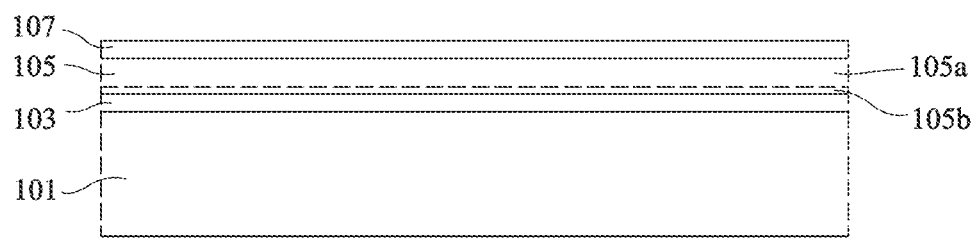
FIG. 4 shows another step of an example of a light-emitting device manufacturing method according to the first embodiment.

FIG. 2 illustrates a step of deposition of a protection layer 107 on the upper surface of GaN layer 105. Layer 107 is for example in contact with the upper surface of GaN layer 105. Layer 107 for example extends over substantially the entire upper surface of GaN layer 105. Layer 107 particularly has the function of preventing or of limiting the exodiffusion of nitrogen from GaN layer 105, and thus the breaking up of the GaN of layer 105, during a subsequent step of the recrystallization anneal of layer 105 (FIG. 4). As an example, layer 107 is made of silicon nitride, for example, of $Si_3N_4$. The thickness of layer 107 is for example in the range from 5 to 500 nm, and preferably from 10 to 50 nm.

Figure 3:
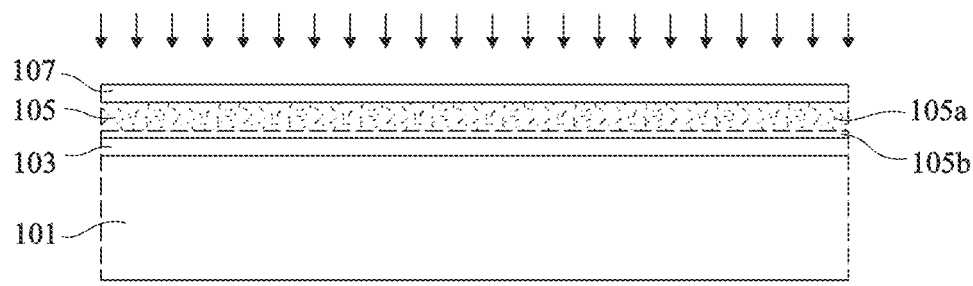
FIG. 3 shows another step of an example of a light-emitting device manufacturing method according to the first embodiment.

FIG. 3 illustrates a step of ion implantation of indium or of aluminum in GaN layer 105, through protection layer 107. The step of ion implantation of FIG. 3 enables to introduce indium or aluminum into GaN layer 105 to modify its composition to obtain an InGaN layer or an AlGaN layer. The implantation energy and the implantation dose enable to define the concentration profile of the new alloy. During this step, a complementary ion implantation of nitrogen may be provided to compensate for the indium or aluminum input and keep the stoichiometry across the depth of the new formed alloy. The implantations energies and doses are selected to obtain a full amorphization of an upper portion 105a of layer 105, and to keep the original crystal reference in a lower portion 105b of layer 105. Preferably, the thickness of the lower reference single-crystal layer 105b is relatively small to enable to carry off possible dislocations or other crystal defects during a subsequent step of recrystallization anneal of layer 105a. As an example, the thickness of the lower reference single-crystal layer 105b is smaller than half the thickness of original layer 105, for example smaller than one fifth of the thickness of original layer 105. As an example, the thickness of lower reference single-crystal layer 105b is in the range from 2 to 100 nm, preferably from 2 to 10 nm. As an example, the implantation energies are selected so that the nitrogen and indium or nitrogen and aluminum concentration profiles are substantially superimposed at the interface between lower single-crystal portion 105b and upper amorphous portion 105a of layer 105, to define a clear interface between crystal layer 105b and amorphous layer 105a.

FIG. 4 illustrates a step of anneal of the structure obtained at the end of the steps of FIGS. 1 to 3, to obtain a solid phase recrystallization of the upper portion 105a of layer 105. The anneal is for example performed at a temperature in the range from 300 to 1,200° C., for example, from 400 to 1,000° C. The duration of the recrystallization anneal is for example in the range from 1 minute to 10 hours. As an example, the anneal is performed at approximately 400° C. for approximately 1 hour. During this step, a recrystallization of InGaN or AlGaN layer 105a is obtained. The crystal reference is provided by the underlying single-crystal GaN layer 105b. The proportion of indium or of aluminum of the new crystal layer 105a is defined by the ion implantation doses provided at the previous step.

Figure 5:
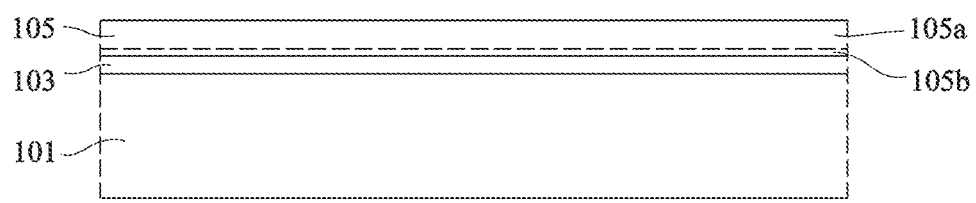
FIG. 5 shows another step of an example of a light-emitting device manufacturing method according to the first embodiment.

FIG. 5 illustrates a step of removal of protection layer 107 to free the access to the upper surface of crystalline InGaN or AlGaN layer 105a.

Figure 6:
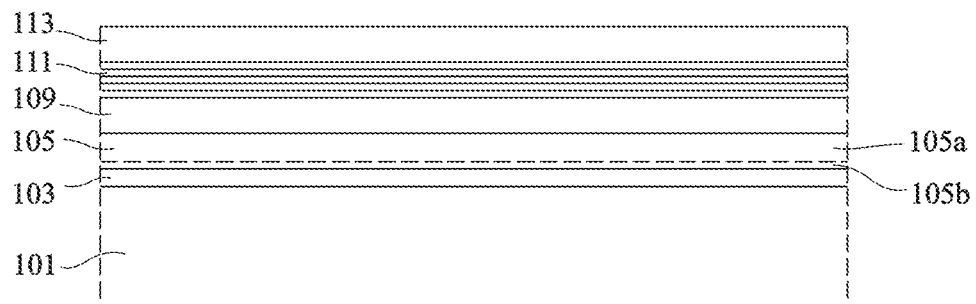
FIG. 6 shows another step of an example of a light-emitting device manufacturing method according to the first embodiment.

FIG. 6 illustrates a step of resumption of the growth, for example, by vapor phase epitaxy, from the upper surface of layer 105a, to form the actual light-emitting structure. As an example, the step of FIG. 6 comprises a step of epitaxial growth of a first doped semiconductor layer 109 of a first conductivity type, for example, type N, on the upper surface of layer 105a, followed by a step of epitaxial growth of an emissive active layer 111 on the upper surface of layer 105a, followed by a step of epitaxial growth of a doped semiconductor layer 113 of the second conductivity type, for example, of type P, on the upper surface of active layer 111. Layer 109 is for example in contact with the upper surface of layer 105a. Active layer 111 is for example in contact with the upper surface of layer 109. An electron barrier layer (not shown in FIG. 6) may form an interface between active layer 111 and layer 113. Layer 109 is for example made of an alloy of InGaN or of AlGaN having the same composition as layer 105a, but N-type doped. Active layer 111 for example comprises confinement means corresponding to multiple quantum wells. As an example, active layer 111 is formed of an alternation of semiconductor layers of a first material and of semiconductor layers of a second material, each layer of the first material being sandwiched between two layers of the second material, the first material having a narrower bandgap than that of the second material, to define multiple quantum wells. In the case where layer 105a is made of InGaN, the first material may be InGaN and the second material may be GaN or InGaN having an indium concentration smaller than that of the first material. In the case where layer 105a is made of AlGaN, the first material may be AlGaN and the second material may be AlGaN having an aluminum concentration greater than that of the first material. Layer 113 is for example a P-type doped InGaN layer in the case where layer 105a is made of InGaN or a P-type doped AlGaN layer in the case where layer 105a is made of AlGaN.

According to the type of light-emitting device which is desired to be formed (individually-controllable multiple cell image display device, illumination device with multiple cells connected in series or in parallel, single-cell illumination device, etc.) a subsequent step (not shown) of etching vertical trenches of singularization of light-emitting cells, particularly crossing layers 113 and 111 of the structure of FIG. 6, may be provided. As a variation, the singularization of the elementary cells of the device may be achieved before the step of FIG. 6 of epitaxial growth of the light-emitting structure. For this purpose, vertical singularization trenches may for example be etched in layer 105, after the recrystallization anneal of upper portion 105a of layer 105 and before the deposition steps of FIG. 6.

An advantage of the method described in relation with FIGS. 1 to 6 is that the steps of ion implantation (FIG. 3) and of solid phase recrystallization anneal (FIG. 4) enable to adjust the indium or aluminum concentration in layer 105a used as a base for the epitaxial growth of the actual light-emitting structure (that is, the stack comprising layers 109, 111, and 113). In particular, this method enables, starting from a single-crystal GaN layer 105, to obtain a crystalline InGaN layer 105a having a relatively high indium concentration, for example, greater than 10%, or a crystalline AlGaN layer 105a having a relatively high aluminum concentration, for example, greater than 50%. The indium or aluminum concentration of base crystal layer 105a may in particular be selected to be close to the indium or aluminum concentration of the InGaN or AlGaN layers of active layer 111. This enables, during subsequent steps of epitaxial growth of the actual light-emitting structure, to obtain a good crystal quality of the deposited layers and particularly of active layer 111, including when the indium or aluminum concentration of the layers of the light-emitting structure is high.

In particular, in the case of the manufacturing of a light-emitting device based on InGaN, this is a significant advantage over the methods described in the above-mentioned article "Bridging the green gap with a new foundation", and in the article entitled "Enhanced In incorporation in full InGaN heterostructure grown on relaxed InGaN pseudo-substrate" of A. Even et al. (Applied Physics Letters 110, 262103 (2017)), where the epitaxial growth of the light-emitting structure is performed from a single-crystal InGaN substrate formed by vapor phase epitaxy, having an indium concentration which remains low (in the order of 4%).

Another advantage of the above-described method is that, since the composition of base layer 105a is adjusted ex post facto, by implantation and solid phase recrystallization, light-emitting cells having their base layers 105a exhibiting different indium or aluminum concentrations may be formed from a same original single-crystal layer 105, which is not possible with the methods described in the above-mentioned articles.

FIGS. 7 to 12 are cross-section views illustrating successive steps of an example of a method of manufacturing a light-emitting device according to a second embodiment.

In the second embodiment, it is desired to form a light-emitting device comprising a plurality of light-emitting cells capable of emitting in different wavelength ranges. An embodiment of a device based on InGaN comprising a first cell B capable of mainly emitting blue light, for example, in a wavelength range from 400 to 490 nm, a second cell G capable of mainly emitting green light, for example, in a wavelength range from 490 to 570 nm, and a third cell R capable of mainly emitting red light, for example, in a wavelength range from 570 to 710 nm, will more particularly be described hereafter. It will be within the abilities of those skilled in the art to adapt this method to form any light-emitting device based on InGaN or on AlGaN comprising at least two cells capable of emitting in different wavelength ranges.

Figure 7:
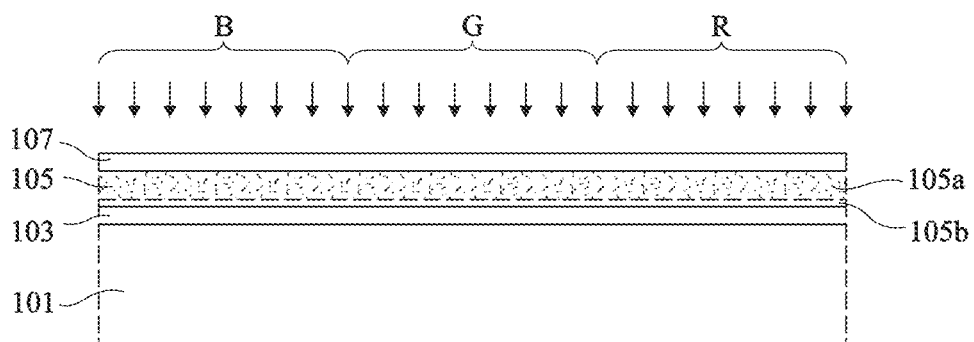
FIG. 7 shows a step of an example of a light-emitting device manufacturing method according to a second embodiment.

FIG. 7 illustrates a first implantation step identical or similar to that of FIG. 3. This step is preceded by steps (not shown again) identical or similar to the steps of FIGS. 1 and 2. During the step of FIG. 7, the implanted indium corresponds to the dose necessary to form the cell having the smallest indium concentration, that is, cell B in the present example. As an example, the implanted indium dose is selected to obtain an indium concentration in the order of 5% in upper portion 105a of layer 105. The first indium dose is implanted over substantially the entire surface of the device, that is, not only in cell B, but also in cells G and R.

Figure 8:
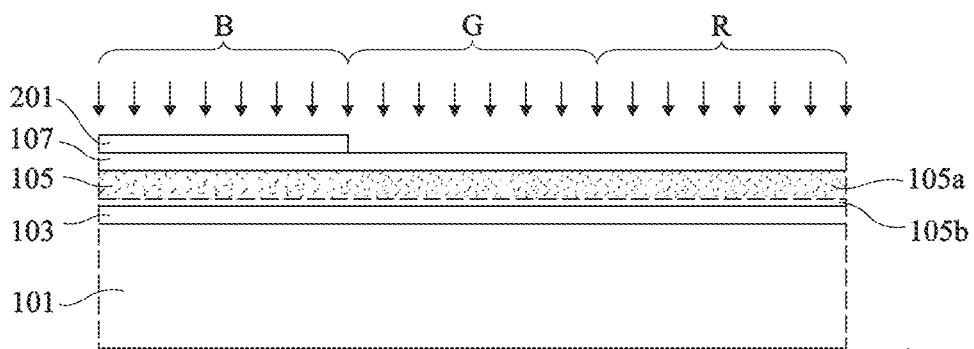
FIG. 8 shows another step of an example of a light-emitting device manufacturing method according to the second embodiment.

FIG. 8 illustrates a step of forming, for example, by deposition and etching, a first implantation mask 201 on the upper surface of protection layer 107. The function of mask 201 is to protect cell B during a second step of indium implantation into cells G and R. As an example, mask 201 substantially covers the entire upper surface of cell B and does not cover the upper surface of cells G and R. Mask 201 is for example formed by a silicon oxide layer, for example, having a thickness in the range from 500 nm to 1 μm, for example, in the order of 600 nm, comprising local openings opposite cells G and R.

FIG. 8 further illustrates a second indium implantation step, similar to the step of FIG. 7, but during which only cells G and R of the device are implanted into, cell B being protected by mask 201. During this step, the implanted indium dose corresponds to the dose necessary to form, taking into account the dose already implanted during the step of FIG. 7, the cell having the second lowest indium concentration, that is, cell G in the present example. As an example, the indium dose implanted during the step of FIG. 8 is selected to obtain an indium concentration in the order of 10% in upper portion 105a of layer 105 in cells G and R. As an example, the implantation doses and energies involved during the implantation step of FIG. 8 are substantially the same as during the implantation step of FIG. 7.

Figure 9:
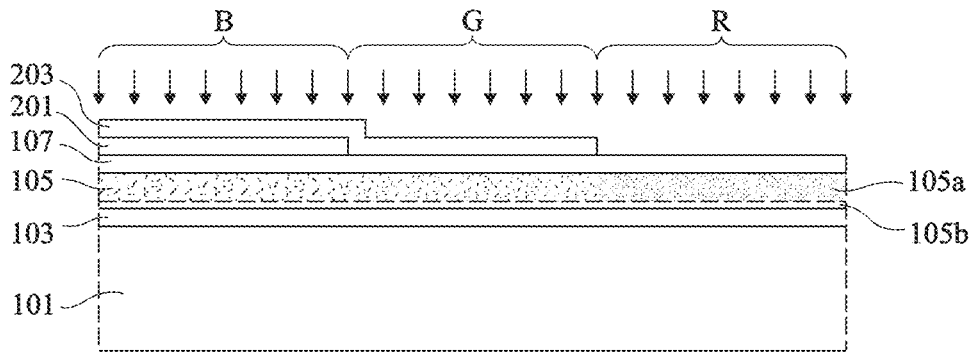
FIG. 9 shows another step of an example of a light-emitting device manufacturing method according to the second embodiment.

FIG. 9 illustrates a step of forming, for example, by deposition and etching, a second implantation mask 203 on the upper surface of the structure obtained at the end of the steps of FIGS. 7 and 8. The function of mask 203 is to protect cell G during a third step of indium implantation into cell R. As an example, mask 203 substantially covers the entire upper surface of cells B and G and does not cover the upper surface of cell R. Mask 203 is for example made of the same material and substantially has the same thickness as mask 201.

FIG. 9 further illustrates a third indium implantation step, similar to the implantation steps of FIGS. 7 and 8, but during which only cell R of the device is implanted into, cells B and G being protected by masks 201 and 203. During this step, the implanted indium dose corresponds to the dose necessary to form, taking into account the doses already implanted during the implantation steps of FIGS. 7 and 8, the cell having the highest indium concentration, that is, cell R in the present example. As an example, the indium dose implanted during the step of FIG. 9 is selected to obtain an indium concentration in the order of 15% in upper portion 105a of layer 105 in cell R. As an example, the implantation doses and energies involved during the implantation step of FIG. 9 are substantially the same as during the implantation steps of FIGS. 7 and 8.

Figure 10:
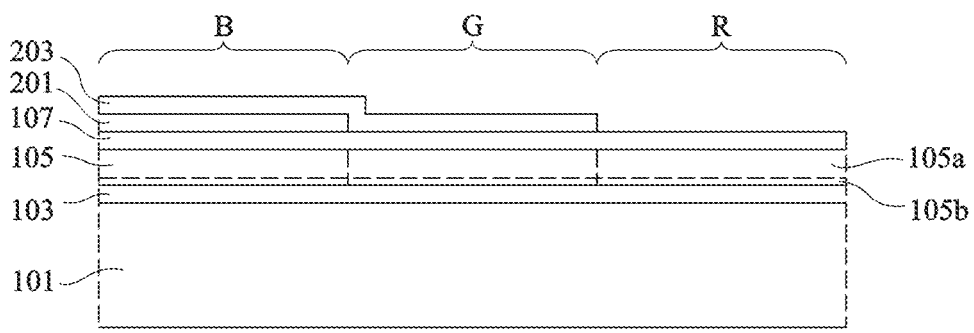
FIG. 10 shows another step of an example of a light-emitting device manufacturing method according to the second embodiment.

FIG. 10 illustrates a step of annealing the structure obtained at the end of the step of FIGS. 7 to 9, to obtain a solid phase recrystallization of upper portion 105a of layer 105. The anneal is for example carried out in conditions identical or similar to what has been described hereabove in relation with FIG. 4. During this step, a recrystallization of InGaN layer 105a is obtained. The crystal reference is provided by the underlying single-crystal GaN layer 105b. The proportion of indium or of aluminum of the new crystal layer 105a is defined by the ion implantation doses provided during the previous steps. Thus, the indium concentration in layer 105a is higher in cell R than in cell G, and higher in cell G than in cell B.

Figure 11:
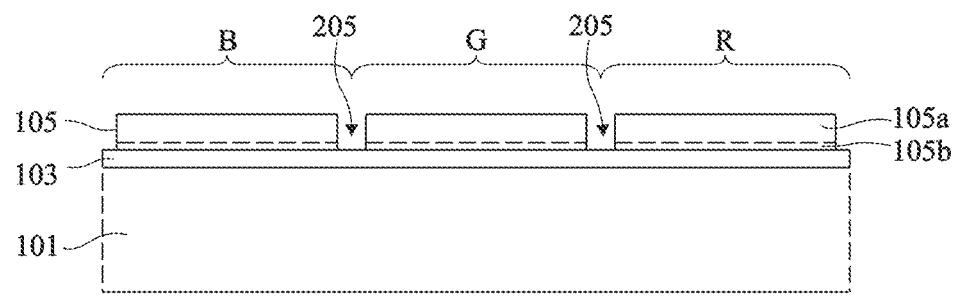
FIG. 11 shows another step of an example of a light-emitting device manufacturing method according to the second embodiment.

FIG. 11 illustrates a step of removing, for example by etching, implantation masks 201 and 203 and of protection layer 107, to free the access to the upper surface of crystalline InGaN layer 105a over substantially the entire surface of the device.

FIG. 11 further illustrates a step of etching, from the upper surface of layer 105a, vertical trenches 205 laterally delimiting and insulating from one another cells B, G, and R of the device. In the shown example, trenches 205 entirely cross layer 105 and stop on the upper surface of layer 103.

Figure 12:
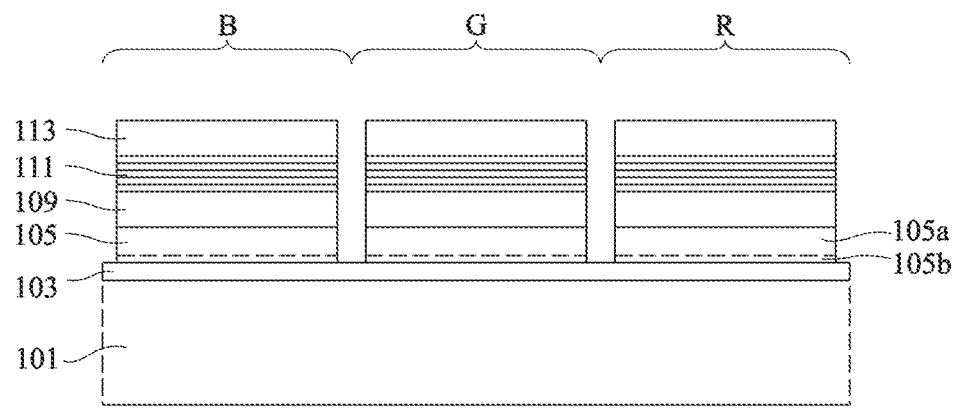
FIG. 12 shows another step of an example of a light-emitting device manufacturing method according to the second embodiment.

FIG. 12 illustrates a step of resumption of the growth, for example, by vapor phase epitaxy, from the upper surface of layer 105a, to form the light-emitting structures of cells B, G, and R. As an example, the forming of the light-emitting structures comprises, as in the example of FIG. 6, a step of epitaxial growth of a first doped semiconductor layer 109 of a first conductivity type, for example, of type N, on the upper surface of layer 105a, followed by a step of epitaxial growth of an emissive active layer 111 on the upper surface of layer 105a, followed by a step of epitaxial growth of a doped semiconductor layer 113 of the second conductivity type, for example, type P, on the upper surface of active layer 111.

In this example, the light-emitting structures of cells B, G, and R are formed simultaneously, in the same vapor phase epitaxial growth conditions. Indeed, the sole fact for the indium concentration in seed layer 105a to be different in the different cells of the device enables to obtain different indium concentrations in the active layers of the different cells, and thus different emission wavelengths in the different cells.

As a variation (not shown), rather than forming the trenches 205 of singularization of the different cells before the growth of the light-emitting structures as described hereabove, the light-emitting stack may be continuously grown over the entire surface of the device and then, only after the growth of the light-emitting stack, vertical trenches crossing layers 113, 111, and possibly layers 109 and 105, laterally delimiting and insulating cells B, G, and R of the device from one another, may be etched.

Various embodiments and variations have been described. It will be understood by those skilled in the art that certain features of these various embodiments and variations may be combined, and other variations will occur to those skilled in the art. In particular, the described embodiments are not limited to the numerical values mentioned as an example in the description.

Further, although only embodiments of light-emitting devices have been described herein, the described methods may be adapted to the forming of photodiodes, of HEMTs ("High Electron Mobility Transistors") or, more generally, of any electronic component based on indium gallium nitride or based on aluminum gallium nitride.

The invention claimed is:

1. A method comprising:
   processing a first single-crystal gallium nitride layer for use in an electronic device, comprising the successive steps of:
   a) performing an ion implantation of indium or of aluminum into an upper portion of the first single-crystal gallium nitride layer to make the upper portion of the first single-crystal gallium nitride layer amorphous without amorphizing a lower portion of the first single-crystal gallium nitride layer; and
   b) performing a solid phase recrystallization anneal of the upper portion of the first single-crystal gallium nitride layer, resulting in transforming the upper portion of the first single-crystal gallium nitride layer into a crystalline indium gallium nitride or aluminum gallium nitride layer,
   wherein, during step a), a complementary implantation of nitrogen is performed to compensate for the indium or aluminum input in the upper portion of the first single-crystal gallium nitride layer.

2. The method of claim 1, further comprising, after step b), a step c) of deposition, by vapor phase epitaxy, on an upper surface of the first single-crystal gallium nitride layer, of a light-emitting structure comprising:
   a doped semiconductor layer of a first conductivity type coating the upper surface of the first single-crystal gallium nitride layer;
   an active layer coating an upper surface of the doped semiconductor layer of the first conductivity type; and
   a doped semiconductor layer of a second conductivity type coating the upper surface of the active layer.

3. The method of claim 1, wherein, during steps a) and b), a protection layer covers an upper surface of the first single-crystal gallium nitride layer.

4. The method of claim 1, wherein, at step a), implantation conditions are selected so that the lower portion of the first single-crystal gallium nitride layer has a thickness smaller than one fifth of the thickness of the first single-crystal gallium nitride layer.

5. The method of claim 1, wherein, during step a), implantation conditions are selected so that the lower portion of the first single-crystal gallium nitride layer has a thickness in the range from 2 to 10 nm.

6. The method of claim 1, wherein implantation energies are selected so that the indium and nitrogen or aluminum and nitrogen concentration profiles are superimposed at the interface between the upper portion and the lower portion of the first single-crystal gallium nitride layer.

7. The method of claim 1 wherein, at step b), the solid phase recrystallization anneal is carried out at a temperature in the range from 300 to 1,200° C.

8. The method of claim 1, wherein the solid phase recrystallization anneal is carried out at approximately 400° C. for approximately 1 hour.

9. The method of claim 1, wherein, during steps a) and b), the first single-crystal gallium nitride layer rests on an insulating layer itself resting on a support substrate.

10. The method of claim 1, wherein the electronic device is a light-emitting device.

11. The method of claim 1, wherein the electronic device is a photoelectric conversion device.

12. The method of claim 1, wherein the electronic device is a HEMT transistor.

* * * * *